United States Patent
Wardhan et al.

(10) Patent No.: US 12,387,133 B2
(45) Date of Patent: Aug. 12, 2025

(54) REINFORCEMENT LEARNING BASED SCHEME FOR TUNING MEMORY INTERFACES

(71) Applicant: QUALCOMM Incorporated, San Diego, CA (US)

(72) Inventors: Uttkarsh Wardhan, Bangalore (IN); Vishal Ghorpade, Bangalore (IN); Sanku Mukherjee, Bangalore (IN); Madan Krishnappa, San Diego, CA (US); Pankhuri Agarwal, Bangalore (IN); Sanath Sreekanta Bangalore, Bangalore (IN); Santanu Pattanayak, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 1041 days.

(21) Appl. No.: 17/084,508

(22) Filed: Oct. 29, 2020

(65) Prior Publication Data

US 2022/0138613 A1 May 5, 2022

(51) Int. Cl.
*G06N 20/00* (2019.01)

(52) U.S. Cl.
CPC .................................. *G06N 20/00* (2019.01)

(58) Field of Classification Search
CPC .......... G06N 20/00; G06N 3/045; G06N 5/01; G06N 7/01; G06N 20/10; G06N 3/006; G06N 3/092; G06N 3/08; G06N 3/047; G06N 3/088; G06N 3/0985; G11C 29/022; G11C 29/023; G11C 29/028
See application file for complete search history.

(56) References Cited

U.S. PATENT DOCUMENTS

| 6,442,089 B1* | 8/2002 | Fletcher | G11C 7/1069 |
| | | | 365/233.5 |
| 7,647,467 B1* | 1/2010 | Hutsell | G06F 13/4239 |
| | | | 711/170 |
| 11,403,000 B1* | 8/2022 | Barker, Jr. | G06F 3/0664 |
| 2007/0211527 A1* | 9/2007 | Hsu | G11C 11/4125 |
| | | | 365/185.02 |
| 2013/0155788 A1* | 6/2013 | Brandl | G11C 7/00 |
| | | | 365/189.011 |

(Continued)

OTHER PUBLICATIONS

Wilson, Aaron et al., "Using Trajectory Data to Improve Bayesian Optimization for Reinforcement Learning," 2014, Journal of Machine Learning Research 15 (2014) 253-282 (Year: 2014).*

(Continued)

*Primary Examiner* — Omar F Fernandez Rivas
*Assistant Examiner* — Tri T Nguyen
(74) *Attorney, Agent, or Firm* — Qualcomm Incorporated/Seyfarth Shaw LLP (57) ABSTRACT

A method performed by a machine learning system includes generating a set of reward values based on a set of parameter values selected by a machine learning system, each reward value of the set of reward values corresponding to a parameter value of the set of parameter values programmed at a device. The method also includes determining a reward function for maximizing a reward corresponding to a set of parameters of the device based on the set of reward values. The method further includes tuning a parameter of the set of parameters based on the reward function.

30 Claims, 6 Drawing Sheets

(56) References Cited

U.S. PATENT DOCUMENTS

| | | | |
|---|---|---|---|
| 2014/0101511 A1* | 4/2014 | Strauss | G06F 13/1689 |
| | | | 710/13 |
| 2016/0041943 A1* | 2/2016 | Hollis | G06F 13/4243 |
| | | | 711/147 |
| 2018/0174640 A1* | 6/2018 | Gupta | G11C 11/413 |
| 2018/0267595 A1* | 9/2018 | Nampoothiri | G06F 1/3225 |
| 2018/0335828 A1* | 11/2018 | Chun | G06F 1/3234 |
| 2018/0351816 A1* | 12/2018 | Li | H04L 67/10 |
| 2019/0034099 A1* | 1/2019 | Ware | G06F 3/0619 |
| 2019/0146864 A1 | 5/2019 | Nair et al. | |
| 2020/0133725 A1* | 4/2020 | Thomas | G06F 9/4893 |

OTHER PUBLICATIONS

Khan, Shuaib Ahmad et al., "Optimization of multi-gigabit transceivers for high speed data communication links in HEP Experiments", Jan. 9, 2019, Nuclear Instruments and Methods in Physics Research Section A: Accelerators, Spectrometers, Detectors and Associated Equipment, vol. 927 (Year: 2019).*

Kiguradze, Zurab et al., "Bayesian Optimization for High-Speed Channel Equalization," 2019, 2019 Electrical Design of Advanced Packaging and Systems (EDAPS), Kaohsiung, Taiwan, 2019, pp. 1-3, doi: 10.1109/EDAPS47854.2019.9011654. (Year: 2019).*

Chang et al., CAPES: Unsupervised Storage Performance Tuning Using Neural Network-Based Deep Reinforcement Learning, Nov. 12, 2017, 14 pages (Year: 2017).*

Snoek J., et al., "Practical Bayesian Optimization of Machine Learning Algorithms", University of Toronto, Universite de Sherbrooke and Harvard University, arXiv:1206.2944v2 [stat.ML] Aug. 29, 2012, pp. 1-12.

International Search Report and Written Opinion—PCT/US2021/055044—ISA/EPO—Feb. 8, 2022.

Schultheis M., et al., "Receding Horizon Curiosity", arxiv.org, Cornell University Library, 201 Olin Library Cornell University Ithaca, NY, 14853, Oct. 8, 2019 (Oct. 8, 2019), 11 Pages, XP081512443, Section 3.

Wang D., et al., "Convolutional Neural Network-Based Deep Learning for Intelligent OSNR Estimation on Eye Diagrams", 2017 European Conference on Optical Communication (ECOC), IEEE, Sep. 17, 2017 (Sep. 17, 2017), pp. 1-3, XP033336298, DOI: 10.1109/ECOC.2017.8345925 [retrieved on Apr. 24, 2018] the whole document.

Wilson A., et al., "Using Trajectory Data to Improve Bayesian Optimization for Reinforcement Learning", Journal of Machine Learning Research, MIT Press, Cambridge, MA, US, vol. 15, No. 1, Jan. 1, 2014 (Jan. 1, 2014), pp. 253-282, XP058050162, ISSN: 1532-4435, Sections 2-4, Algorithms 1, 2, figures 1-4.

* cited by examiner

REINFORCEMENT LEARNING BASED SCHEME FOR TUNING MEMORY INTERFACES

BACKGROUND

Field

Aspects of the present disclosure generally relate to reinforcement learning based tuning of memory interfaces.

Background

High-speed dynamic random access memory (DRAM) may be tuned to reliably operate at speeds higher than 1 GHz. The tuning may be specified for a number of components due to variations in, for example, fabrication, packaging, and/or printed circuit boards (PCBs). In most cases, DRAM is tuned during a manufacturing process. Once deployed, one or more parameters or components may be re-tuned to address changes in operating conditions and/or hardware degradation. Conventional systems perform limited on-chip, mission-mode tuning. It may be desirable to improve on-chip tuning.

SUMMARY

In one aspect of the present disclosure, a method performed by a machine learning model is disclosed. The method includes generating a set of reward values based on a set of parameter values selected by the machine learning model. The method also includes determining a reward function for maximizing a reward corresponding to a set of parameters of the device based on the set of reward values. The method further includes tuning a parameter of the set of parameters based on the reward function.

Another aspect of the present disclosure is directed to an apparatus including means for generating a set of reward values based on a set of parameter values selected by the machine learning model. The apparatus also includes means for determining a reward function for maximizing a reward corresponding to a set of parameters of the device based on the set of reward values. The apparatus further includes means for tuning a parameter of the set of parameters based on the reward function.

In another aspect of the present disclosure, a non-transitory computer-readable medium with non-transitory program code recorded thereon is disclosed. The program code is executed by a processor and includes program code to generate a set of reward values based on a set of parameter values selected by the machine learning model. The program code also includes program code to determine a reward function for maximizing a reward corresponding to a set of parameters of the device based on the set of reward values. The program code further includes program code to tune a parameter of the set of parameters based on the reward function.

Another aspect of the present disclosure is directed to an apparatus. The apparatus having a memory, one or more processors coupled to the memory, and instructions stored in the memory. The instructions being operable, when executed by the processor, to cause the apparatus to generate a set of reward values based on a set of parameter values selected by the machine learning model. The instructions also cause the apparatus to determine a reward function for maximizing a reward corresponding to a set of parameters of the device based on the set of reward values. The instructions addi-tionally cause the apparatus to tune a parameter of the set of parameters based on the reward function.

Aspects generally include a method, apparatus, system, computer program product, non-transitory computer-readable medium, user equipment, base station, wireless communications device, and processing system as substantially described with reference to and as illustrated by the accompanying drawings and specification.

The foregoing has outlined rather broadly the features and technical advantages of examples according to the disclosure in order that the detailed description that follows may be better understood. Additional features and advantages will be described. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout.

DETAILED DESCRIPTION

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Based on the teachings, one skilled in the art should appreciate that the scope of the disclosure is intended to cover any aspect of the disclosure, whether implemented independently of or combined with any other aspect of the disclosure. For example, an apparatus may be implemented or a method may be practiced using any number of the aspects set forth. In addition, the scope of the disclosure is intended to cover such an apparatus or method practiced using other structure, functionality, or structure and functionality in addition to or other than the various aspects of the disclosure set forth. It should be understood that any aspect of the disclosure disclosed may be embodied by one or more elements of a claim.

The word "exemplary" is used to mean "serving as an example, instance, or illustration." Any aspect described as "exemplary" is not necessarily to be construed as preferred or advantageous over other aspects.

Although particular aspects are described, many variations and permutations of these aspects fall within the scope of the disclosure. Although some benefits and advantages of the preferred aspects are mentioned, the scope of the disclosure is not intended to be limited to particular benefits, uses or objectives. Rather, aspects of the disclosure are intended to be broadly applicable to different technologies, system configurations, networks and protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

Memory for a system-on-a-chip (SOC) may be tuned to reliably operate at high speeds, such as speeds higher than 1 GHz. The memory may be a high-speed dynamic random access (DRAM) memory or another type of memory. For ease of explanation, aspects of the present disclosure use DRAM as an example. Still, aspects of the present disclosure are not limited to DRAM. The tuning may be specified for a number of components due to variations in, for example, fabrication, packaging, and/or printed circuit boards (PCBs). In most cases, DRAM is tuned during a manufacturing process. Once deployed, one or more parameters or components may be re-tuned to address changes in operating conditions and/or hardware degradation.

For example, a factory-boot may be performed for data-bus tuning to compensate for a routing skew on a printed circuit board. The tuning may find a stable operating point for a data eye. The stable operating point may be a center of the data eye in a reference voltage and clock delay circuit shmoo-plot. In some cases, periodic tuning is triggered to compensate for a change in operating conditions, such as an increase in operating temperature and voltage.

As DRAM speeds increase, improved optimization of on-chip parameters may be specified to extract the maximized margins of each platform. The on-chip parameters may include DRAM interface parameters, such as pull-up/pull-down, on-die-termination, and/or read/write turn-around time. Some conventional systems do not optimize DRAM interface parameters. Other conventional systems perform limited optimization. For example, conventional systems may perform partial optimization by modeling and simulating real time traffic. The partial optimization may be limited to an accuracy of the real time traffic models, which do not account for device-to-device variations.

In some conventional systems, additional optimizations may be performed on a limited set of interfaces in a tuning environment, such as a laboratory. Optimizations performed in the tuning environment may be referred to as a generic best-fit optimization. The final optimized settings may be broadcast to various DRAM devices. Optimizing parameters in the tuning environment may not account for the large number of devices that are manufactured and shipped across different combinations of parts, platforms, form factors, and original equipment manufacturers. Additionally, a reliability of optimizations performed in a tuning environment decreases as DRAM speeds increase. That is, a generic best-fit optimization does not consider the maximum stability any individual system may offer. Therefore, performance of a DRAM device may be limited by sub-optimal parameters, such as pre-tuned parameters.

Tuning all parameters for all types of DRAM may not be feasible due to the number of parameters. The parameters may include a combination of dependent, independent, and inter-dependent parameters. Some parameters may be specified for per-bit tuning, which increases tuning time due to the number of data-lines in high density DRAM. In other examples, a brute force method attempts all combinations to find best-fit parameters for a factory-boot. The brute force method may not account for periodic training, which is performed while the DRAM is online (e.g., actively used). Additionally, the brute-force method may be time consuming.

Aspects of the present disclosure are directed to sampling a set of parameters (e.g., operating configurations) from an individual DRAM and tuning parameters of the DRAM based on the sampled set of parameters. The tuned parameters may improve the reliability and stability of a high-speed DRAM interface. In one configuration, the parameters are tuned without sampling all parameters. Additionally, aspects of the present disclosure increase the stability and reliability of high-speed DRAM interfaces. In one configuration, performance is increased and power is reduced by optimizing DRAM parameters (e.g., on-chip parameters) with a machine learning model.

Figure 1:
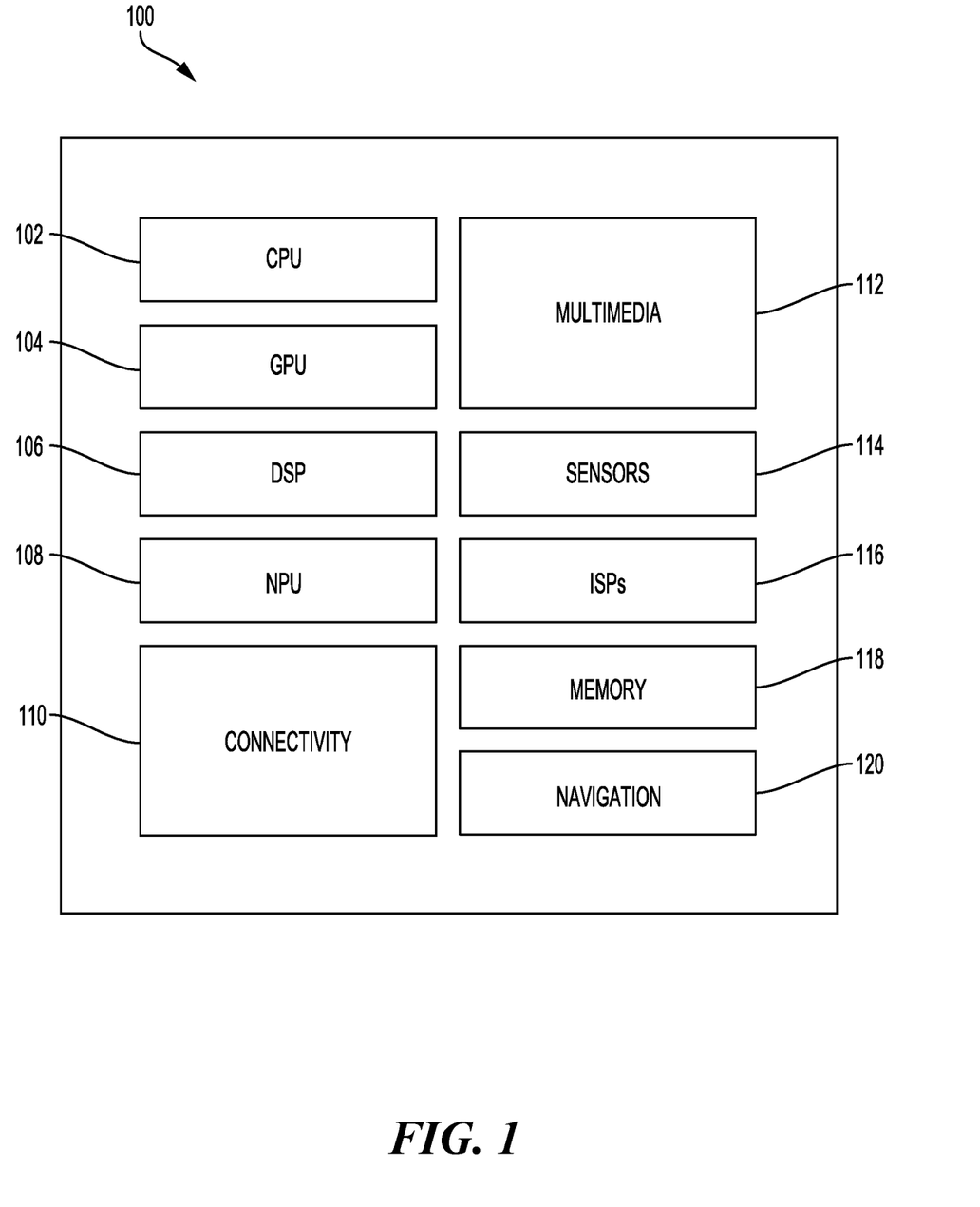
FIG. 1 illustrates an example implementation of designing a machine learning model using a system-on-a-chip (SOC), including a general-purpose processor in accordance with certain aspects of the present disclosure.

FIG. 1 illustrates an example implementation of a system-on-a-chip (SOC) 100, which may include a central processing unit (CPU) 102 or a multi-core CPU configured parameter tuning in accordance with certain aspects of the present disclosure. Variables, system parameters associated with a computational device, delays, frequency bin information, and task information may be stored in a memory block associated with a neural processing unit (NPU) 108, in a memory block associated with a CPU 102, in a memory block associated with a graphics processing unit (GPU) 104, in a memory block associated with a digital signal processor (DSP) 106, in a memory block 118, or may be distributed across multiple blocks. The NPU 108 may execute a machine learning model. Instructions executed at the CPU 102 may be loaded from a program memory associated with the CPU 102 or may be loaded from a memory block 118.

The SOC 100 may also include additional processing blocks tailored to specific functions, such as a GPU 104, a DSP 106, a connectivity block 110, which may include fifth generation (5G) connectivity, fourth generation long term evolution (4G LTE) connectivity, Wi-Fi connectivity, USB connectivity, Bluetooth connectivity, and the like, and a multimedia processor 112 that may, for example, detect and recognize gestures. In one implementation, the NPU is implemented in the CPU, DSP, and/or GPU. The SOC 100 may also include a sensor processor 114, image signal processors (ISPs) 116, and/or navigation module 120, which may include a global positioning system.

The SOC 100 may be based on an ARM instruction set. In an aspect of the present disclosure, the instructions loaded into the general-purpose processor 102 may comprise code to generate a set of reward values based on a set of parameter values selected by a machine learning model; determine a reward function for maximizing a reward corresponding to a set of parameters of the device based on the set of reward values; and tune a parameter of the set of parameters based on the reward function.

Learning functions for an apparatus implementing a machine learning model may be generally classified into supervised learning and unsupervised learning. Reinforcement learning may be based on unsupervised learning. As an example, reinforcement learning may learn decisions, classifications, and/or actions based on a reward. That is, reinforcement learning may learn to take an appropriate action in an environment by learning to maximize a future reward. Aspects of the present disclosure are directed to selecting one or more parameters to improve performance of a device while reducing power consumption. The one or more parameters may be examples of an action.

A reinforcement learning model may be specified for a decision-making task in a reinforcement learning framework. The input to an agent of the reinforcement learning model may be a state s. The output of the reinforcement learning model may be a state-action value function Q( ) for all available actions a for the given state s (e.g., Q(s, a)). A state-action value function Q( ) provides a cumulative reward (e.g., quality (Q) value). The Q value may be the sum of the immediate reward from selecting an action a from the state s and the highest Q value possible from a subsequent state (e.g., the state s+1 after taking action a from a current state s). With respect to the combination of a state s and action a, the true value of the value Q(s, a) may not be initially known. An agent may select one or more actions a under a certain state s, and may receive one or more rewards for the actions a. In this way, the agent learns to select an action that maximizes a reward (e.g., a best action).

Figure 2:
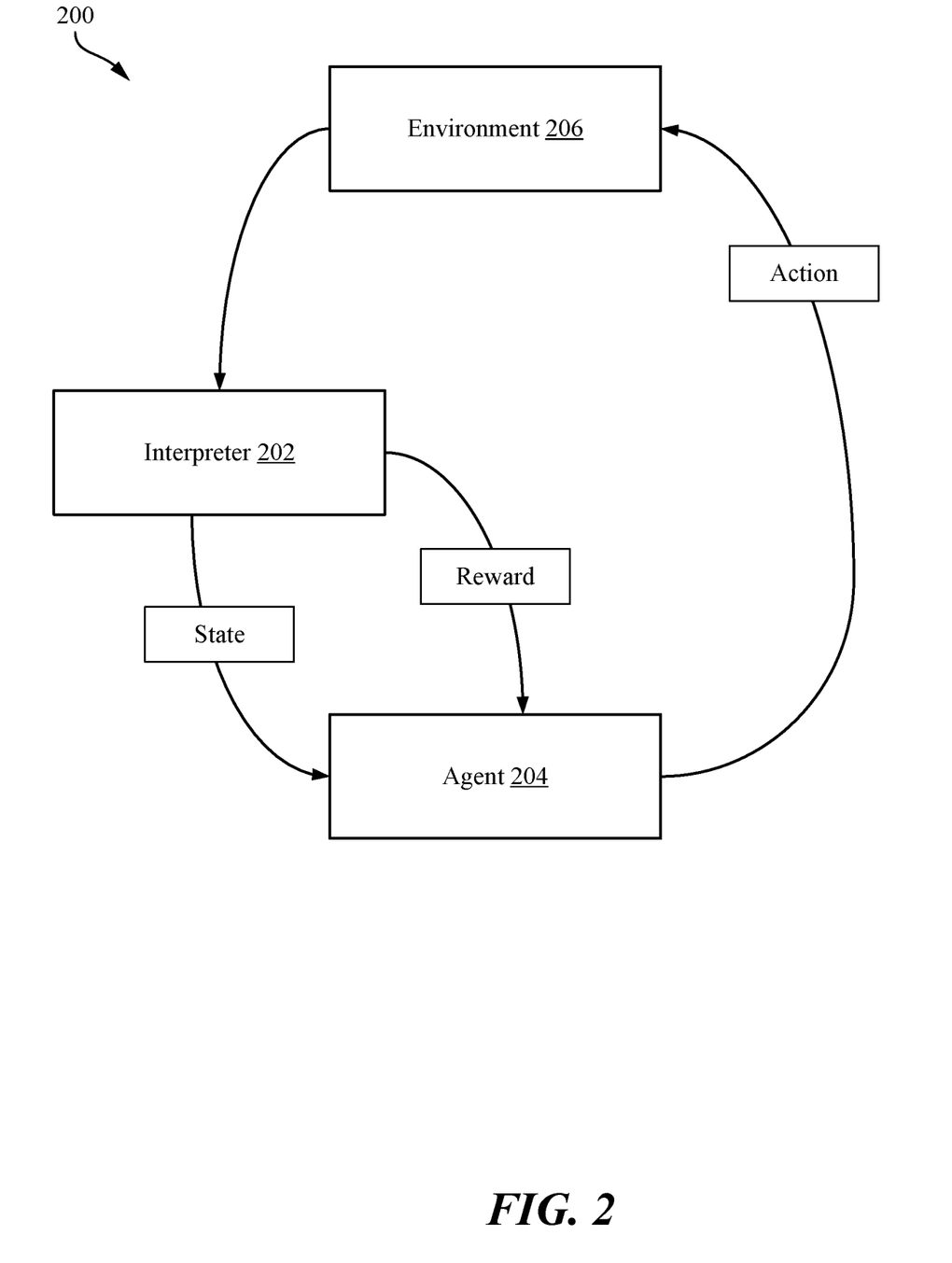
FIG. 2 is a block diagram illustrating an example of a reinforcement learning model, in accordance with aspects of the present disclosure.

FIG. 2 is a block diagram illustrating an example of a reinforcement learning model 200, in accordance with aspects of the present disclosure. One or more components of the reinforcement learning model 200, such as the agent 204, the environment 206, and/or the interpreter 202, may be components of the SOC 100. Alternatively, the reinforcement learning model 200 may be a separate device working in conjunction with the SOC 100. In the example of FIG. 2, an agent 204 may learn to take an action based on state s observed by an interpreter 202. Additionally, the agent 204 may interact with an environment 206 to maximize a total reward which may be observed by the interpreter 202 and fed back to the agent 204 as reinforcement. In some examples, the agent 204 and interpreter 202 may be implemented as the same or separate components.

In some examples, reinforcement learning is modeled as a Markov decision process (MDP). An MDP is a discrete, time stochastic, control process. The MDP provides a mathematical framework for modeling decision making in situations where outcomes may be partially random while also under control of a decision maker. In MDP, at each time step, the process is in a state s, of a set of S finite states, and the decision maker may choose any action a, of a finite set of actions A, that are available in that state. The process responds at the next time step by randomly moving into a new state, and giving the decision maker a corresponding reward. In other examples, a partially observable MDP is used (POMDP). The POMDP may be used when the state may not be known when the action is taken, and, therefore, the probabilities and/or rewards may be unknown.

As described above, aspects of the present disclosure are directed to increasing stability and reliability of high-speed interfaces (e.g., dynamic access memory (DRAM), peripheral component interconnect express (PCIe), and the like). In one implementation, a machine learning model tunes one or more on-chip parameters to improve performance while reducing power consumption. The on-chip parameters may be tuned at an end-user device (e.g., real-world deployment). The tuning may be referred to as an active adaptive correction of interface parameters.

A system-on-a-chip (SOC), such as the SOC 100 described with reference to FIG. 1, may be implemented in various components, such as a vehicle or a robotic device. Safety and reliability of semiconductor devices (for example, SOCs) in these components may prevent financial loss and harm to human life. Various standards, such as the automotive safety integrity level (ASIL) standard (ISO 26262), standardize and certify the safety and reliability of such components. Compliance testing may be performed to determine whether a component complies with the standards body specifications.

In some implementations, compliance testing may be performed via an eye-diagram analysis. This testing method provides an analysis of a double data rate (DDR) memory's waveform signal integrity by providing a data-eye (e.g., eye diagram). The data-eye may represent a voltage and time plot of an electrical signal. For example, the eye may be represented as a plot of reference voltage (Vref) vs. clock delay (CDC). The quality of the data-eye, such as an eye-opening, symmetry, and/or distortions, may indicate a stability of a signal. The data-eye may be reviewed by a human or a trained neural network to reveal an amount of jitter on the device, a non-monotonic edge, and/or other problems on the device. In conventional systems, engineers may review the data-eye each time the parameters are tuned. The parameters may be continuously tuned until obtaining a satisfactory data-eye.

Figure 3:
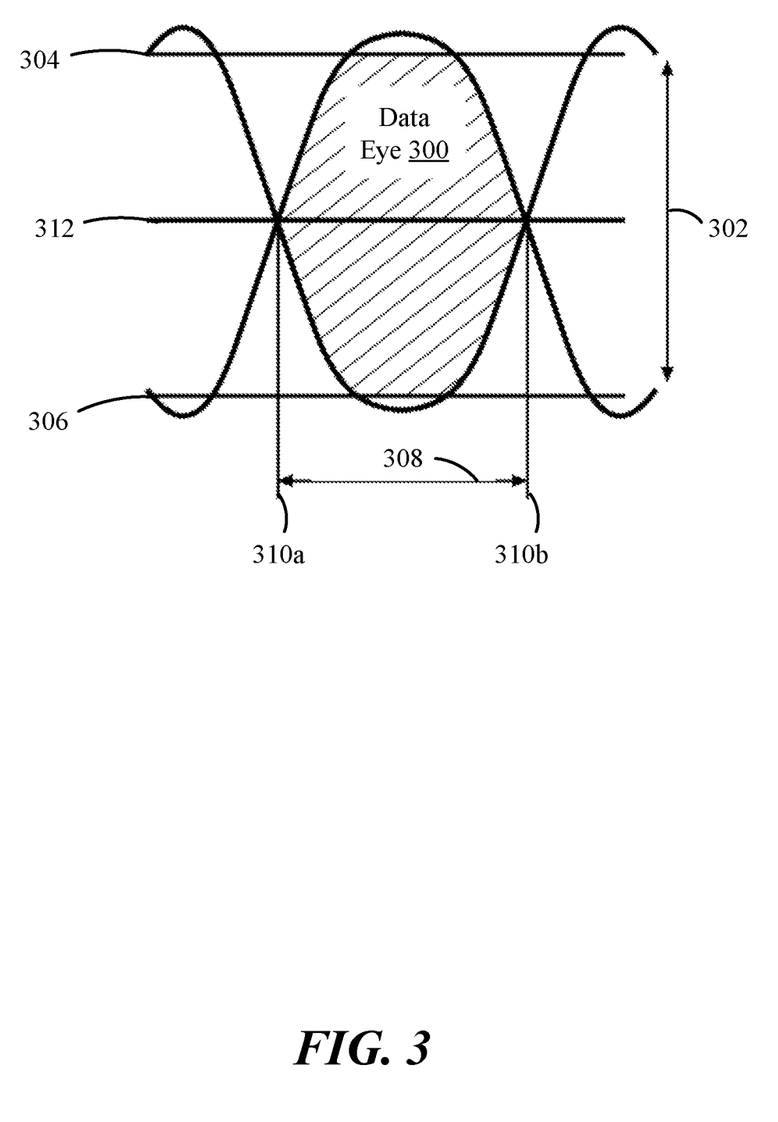
FIG. 3 is a diagram illustrating an example of a data eye, in accordance with aspects of the present disclosure.

As described, a data eye diagram is a time-domain representation of a signal from which the electrical quality of the signal may be visualized. FIG. 3 is a diagram illustrating an example of a data eye 300, in accordance with aspects of the present disclosure. In the example of FIG. 3, a reference signal (VREF) is provided to the device, such as a DDR memory, to produce the data eye 300. As shown in FIG. 3, the data eye 300 has an eye height 302 determined by a high voltage signal 304 and a low voltage signal 306 in the vertical dimension. The data eye 300 has an eye width 308 determined by a pair of cross points 310a, 310b along a time axis. The reference voltage signal (VREF) 312 generates an eye crossing as a function of the reference voltage signal 312, the high voltage signal 304, and the low voltage signal. A symmetric data eye may indicate a high degree of stability and/or robustness.

As described, high-speed external interfaces, such as DRAM, have various configurable parameters corresponding to electrical characteristics and circuit metrics. The parameters may be adjusted (e.g., tuned) to increase or decrease a quality of a transmitted signal. For example, the parameters may be tuned to balance load/impedance or drive-strength to reduce negative effects on a data-line, such as signal-reflection, noise, and/or cross-talk. The configurable parameters may include, for example, signal impedance, drive strength, clock phase delays, on-die termination, and/or data-bus inversion.

Additionally, as described, the parameters may be tuned by engineers in labs to increase signal stability of high-speed interfaces. DRAM reliability may be based on signal stability, as signal stability provides resilience to noise and environmental variations. In conventional systems, initial parameter values are selected based on an informed guess.

Iterative-tuning may be performed based on satisfaction or violation of stability and power criteria. The number of parameters of a high-speed interface may range in the thousands or tens of thousands.

A majority of the parameters may be dependent on process-voltage temperature (PVT) characteristics. Thus, a power-performance of a device, such as a DRAM device, may be limited by sub-optimal parameters. The performance may be further limited because an engineer may not have sufficient time and/or other resources to tune parameters for all devices. As described, in most cases, tuning is performed in a validation lab, and generalized parameters may be propagated to all devices. Due to the number of parameters, including combinations of parameters, conventional systems may fail to adapt to a wide range of environmental changes in a test environment (e.g., real-world deployment). Conventional systems may perform limited tuning (e.g., data-bus tuning and periodic tuning) to partially overcome the described constraints.

In conventional systems, a brute force function and/or a deep learning model may tune parameters of an interface. For example, a brute force function samples all possible combinations to obtain parameters that satisfy stability criteria. As described above, the stability criteria may be determined by analyzing a data-eye. The brute force function is time consuming and not feasible for real-world deployment. That is, the brute force function may not feasibly tune parameters of a deployed device. In other conventional systems, a deep learning model may collect a majority of the samples (for example, seventy percent of the samples) from an entire sample-space to predict parameters for increasing a device's stability. Given the number of configurable parameter combinations, conventional tuning methods, such as deep learning models and brute force functions, are not feasible for end-user applications due to time constraints.

According to aspects of the present disclosure, a machine learning based solution, such as reinforcement learning (RL) model, tunes parameters to increase the stability of a device, such as a DRAM device. As described, a stable signal may be resilient to noise and environmental variations. Therefore, increased signal stability improves signal reliability. A number of parameters sampled by the machine learning based solution is less than a number of parameters sampled by a brute force function and a deep learning model. Thus, the machine learning based solution for tuning parameters may be less time consuming in comparison to the brute force function and the deep learning model.

In one configuration, the machine learning base solution is a RL model specified to model non-linear functions and improve data collection by predicting a sampling point based on one or more prior sampling points. Specifically, the RL model may mimic a human learning scenario where the RL model assimilates available data to predict the outcome of a new action, performs the action to collect new data, and assimilates the new data to predict further actions and results until a goal is achieved.

In aspects of the present disclosure, the RL model requests one or more sampling points when a certainty of a modeled function is less than a certainty threshold. Over multiple iterations, the RL model improves an accuracy of an underlying function, thereby enabling prediction of an optimal point for a parameter to increase signal stability. In one configuration, each parameter is treated as a constrained dimension in an n-dimensional parameter-space. The stability and/or other features may be represented as a feedback or reward. An optimal point for a parameter may be a point in a parameter-space where a reward function is maximized.

Figure 4:
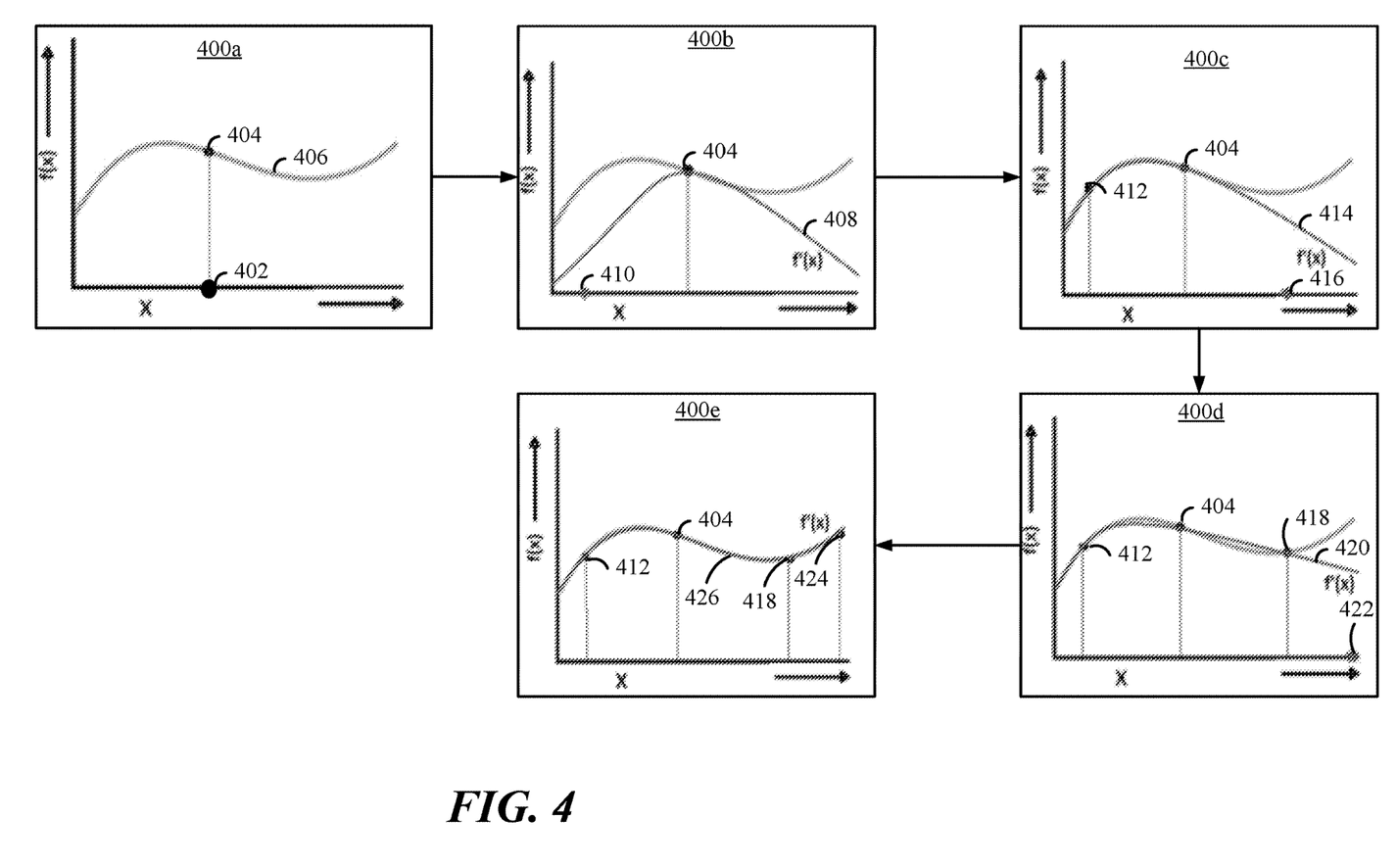
FIG. 4 is a diagram illustrating an example of Bayesian optimization for a machine learning model in a Gaussian process, in accordance with aspects of the present disclosure.

FIG. 4 is a diagram illustrating an example of Bayesian optimization for a machine learning model in a Gaussian process, in accordance with aspects of the present disclosure. As described, the machine learning model may be a reinforcement learning (RL) model. For ease of explanation, the system (e.g., device) receives a single input x and generates a non-linear output based on a function f(x).

In the example of FIG. 4, as shown in block 400a, a machine learning model selects a first parameter value x 402 and determines a corresponding output of a function f(x). According to aspects of the present disclosure, the first parameter value x 402 may be randomly selected, selected based on historical data from prior parameter adjustments, or previous training. The first parameter value x 402 may be a value for a parameter of a device, such as a DRAM device. The output of the function f(x) may be a reward value based on reward criteria, such as a stability and/or power performance of a data-eye corresponding to the first parameter value x 402. That is, a first point 404 may correspond to a data-eye quality as a function f(x) of the input x. As shown in block 400a, the output of the function f(x) is the first point 404 on a reward value plot 406 of the system. The reward value plot 406 represents the data-eye quality (e.g., reward value) of different parameter values x (x-axis) based on the function f(x) (y-axis).

Based on the first point 404, the machine learning model predicts a smooth-curved function f'(x) 408 (in block 400b). That is, the machine learning model predicts a reward function f'(x) based on all available sampled points. Additionally, the machine learning model may identify points of the predicted reward function f'(x) with an uncertainty that is greater than a threshold. The uncertainty of a point may be greater than a threshold if multiple reward functions f'(x) may be predicted for the parameter value x corresponding to the point. That is, the uncertainty may be above the threshold if multiple smooth-curved reward functions f'(x) 408 correspond to the parameter value x.

In the current example, at block 400b, the machine learning model determines the uncertainty is greater than a threshold at a point corresponding to a second parameter value x 410. The second parameter value x 410 is provided to the system and the corresponding reward value is returned to the machine learning model. That is, at block 400c, the machine learning model determines a second point 412 based on the second parameter value x 410. Additionally, at block 400c, the machine learning model predicts a second smooth-curved reward function f'(x) 414 based on the first point 404 and the second point 412. Additionally, at block 400c, the machine learning model determines the uncertainty is greater than the threshold for a point on the second smooth-curved reward function f'(x) 414 corresponding to a third parameter value x 416.

In the example of FIG. 4, at block 400d, the machine learning model determines a third point 418 corresponding to the third parameter value x 416. Furthermore, at block 400d, the machine learning model predicts a third smooth-curved reward function f'(x) 420 based on the first point 404, the second point 412, and the third point 418. Additionally, at block 400d, the machine learning model determines the uncertainty is greater than the threshold for a point on the third smooth-curved function f'(x) 420 corresponding to a fourth parameter value x 422.

At block 400e, the machine learning model determines a fourth point 424 corresponding to the fourth parameter value x 422. Furthermore, at block 400e, the machine learning model predicts a fourth smooth-curved reward function f'(x) 426 based on the first point 404, the second point 412, the third point 418, and the fourth point 424. Additionally, at block 400e, the machine learning model determines the uncertainty for all points on the fourth smooth-curved reward function f'(x) 426 is less than the threshold. Thus, at block 400e, the predicted reward function f'(x) may be similar to the actual function f(x) and the training may be complete. After determining the reward function f'(x), the RL model may select parameter values that maximize a value returned by the reward function f'(x).

According to aspects of the present disclosure, a number of sampled points, such as the first point 404, the second point 412, the third point 418, and fourth point 424, for a machine learning based solution (e.g., RL model) may be less than a number of sampled points for the deep learning based solution.

Figure 5:
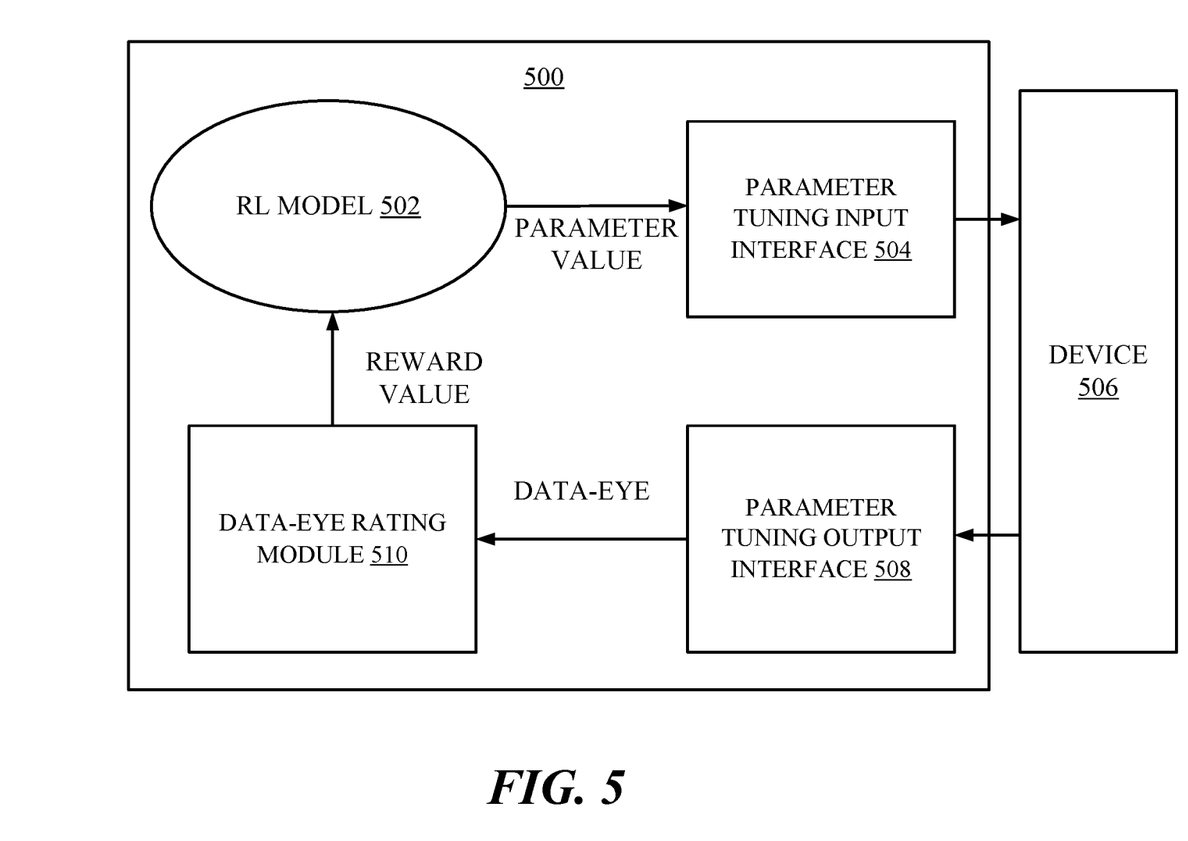
FIG. 5 illustrates an example of a dynamic random access memory (DRAM) parameter tuning system, in accordance with aspects of the present disclosure.

The RL model described with reference to FIG. 4 may be a component of a parameter tuning system, such as a DRAM parameter tuning system. FIG. 5 illustrates an example of a DRAM parameter tuning system 500, in accordance with aspects of the present disclosure. As shown in FIG. 5, the DRAM parameter tuning system 500 may include an RL model 502, a parameter tuning input interface 504, a device 506, a parameter tuning output interface 508, and a data-eye rating module 510. The device 506 may be a type of DRAM, such as double data rate (DDR) DRAM.

In one configuration, the RL model 502 tunes parameters of the device 506 by maximizing a reward of a reward function (f'(x)). In one configuration, the RL model 502 generates the reward function based on reward values provided by the data-eye rating module 510. Different types of rewards may be considered. In one configuration, the data-eye rating module 510 generates a reward value based on reward criteria, which may include a stability and/or power-performance criteria. In the example of FIG. 5, the RL model 502 may determine the reward function by sampling parameters of the device 506.

In one configuration, when determining the reward function, the RL model 502 selects one or more parameter values. For example, the RL model 502 may select a first parameter value x 402 as described with respect to FIG. 4. The first value x 402 may be randomly selected. The first parameter value x 402 may be received at a parameter tuning input interface 504, which may program the device 506 according to the first parameter value x 402. The parameter tuning output interface 508 samples a data-eye based on the currently programmed configuration of the device 506. In this example, the parameter tuning output interface 508 samples the data-eye based on the programmed first parameter value x 402. The data-eye may be a shmoo-plot of an interface reference voltage vs. a sampling delay. The data-eye rating module 510 receives the data-eye and generates a rating corresponding to one or more of the stability or power performance of the data-path, at a given operating frequency. In one configuration, the data-eye rating module 510 is a convolutional neural network trained to generate stability scores for data-lines of the device 506. The power performance refers to an amount of power used by the data path. The rating may be output to the RL model 502, and the RL model 502 may generate a reward function f'(x) based on the rating. That is, the rating output by the data-eye rating module 510 may correspond to a point on a plot, such as a first point 404 on the reward value plot 406 described with reference to FIG. 4.

The RL model 502 may continue to sample parameters from the device 506 until an uncertainty of a predicted function f'(x) is less than a threshold. After generating (e.g., learning) the predicted function f'(x), the RL model 502 may tune parameters of the device 506. The parameters may be tuned to maximize a reward of the predicted function f'(x). For example, after generating the reward function, the RL model 502 may be a parameter value that yields a highest reward from the reward function. The reward may be a predicted stability score and/or power performance. The parameter value with the highest reward may be selected for tuning the device 506. The device 506 may be programmed with the selected value. That is, the selected value may be applied to one or more parameters of the device 506.

As described above, in one configuration, parameters of a device are individually tuned to improve power-performance. Each parameter may be treated as a constrained dimension in an n-dimensional parameter-space. The stability and/or power may be represented as feedback or reward. Therefore, a most optimal parameter may correspond to a point in the parameter-space (e.g., f'(x)) where the reward function is maximized.

As described with respect to FIG. 4, the machine learning model (e.g., RL model) samples parameters (e.g., inputs) to learn a prediction function f'(x). To improve training, parameters (e.g., DRAM interface parameters) may be classified into groups. The groups may include, for example, limited range integral parameters, global parameters, channel-wise parameters, and per-bit parameters. The RL model may be trained on individual groups.

In one configuration, the RL model may be initialized with limited range integral parameters, which may include parameters with a limited number of values (e.g., less than ten values). The limited range integral parameters may be independent of each other. A subset of the limited range integral parameters may be collected offline before sampling the parameters with the RL model for training. The limited range integral parameters may provide initial data for learning the predicted function f'(x) of the RL model, such that an initial prediction function f'(x) may be learned without sampling all limited range integral parameters.

Global parameters may be specified for coarse tuning. The global parameters may be parameters that apply to all the bits in the DRAM interface, and may be generic, top-level parameters. The RL model may tune the global parameters for a single data-line, and apply the tuned parameters for other data-lines (e.g., bits in the DRAM interface). The global parameters may be used to obtain a semi-converged configuration for the RL model.

After tuning global parameters, the RL model 502 may tune channel-wise parameters. The channel-wise parameters may apply to all bits in any given DRAM channel. The bits in a DRAM channel may be in close proximity, both physically and logically. In one configuration, parameter values for one data-line in one channel may be applied to all data-lines in a channel. For example, the device 506 may include eight eight-bit channels. In this example, for each channel, the RL model 502 may tune one-bit and apply the tuned parameters to the remaining seven-bits.

After tuning the channel-wise parameters, the RL model 502 may tune individual bits for a single data-line (e.g., per-bit training). Because the RL model 502 tunes global parameters and channel-wise parameters prior to tuning per-bit parameters, the number of per-bit parameters may be limited. Therefore, a time for tuning per-bit parameters may be reduced in comparison to conventional tuning systems.

Aspects of the present disclosure may enable autonomous tuning for devices, such as memory (e.g., DRAM). Furthermore, aspects of the present disclosure may increase the reliability of SOCs. Reliable SOCs may be specified for mission critical devices such as automobiles and autonomous industrial devices. In some examples, a parameter tuning method may be triggered for mission critical devices, as well as other types of devices, in response to a health-check, failure detection, and/or data-eye analysis. The parameter tuning method may provide failure prevention by updating (e.g., tuning) parameters to mitigate a failure.

Aspects of the present disclosure are not limited to DRAMs and/or SOCs. Other types of devices, such as devices with high-speed interfaces (e.g., peripheral component interconnect express (PCIe)), are contemplated.

Figure 6:
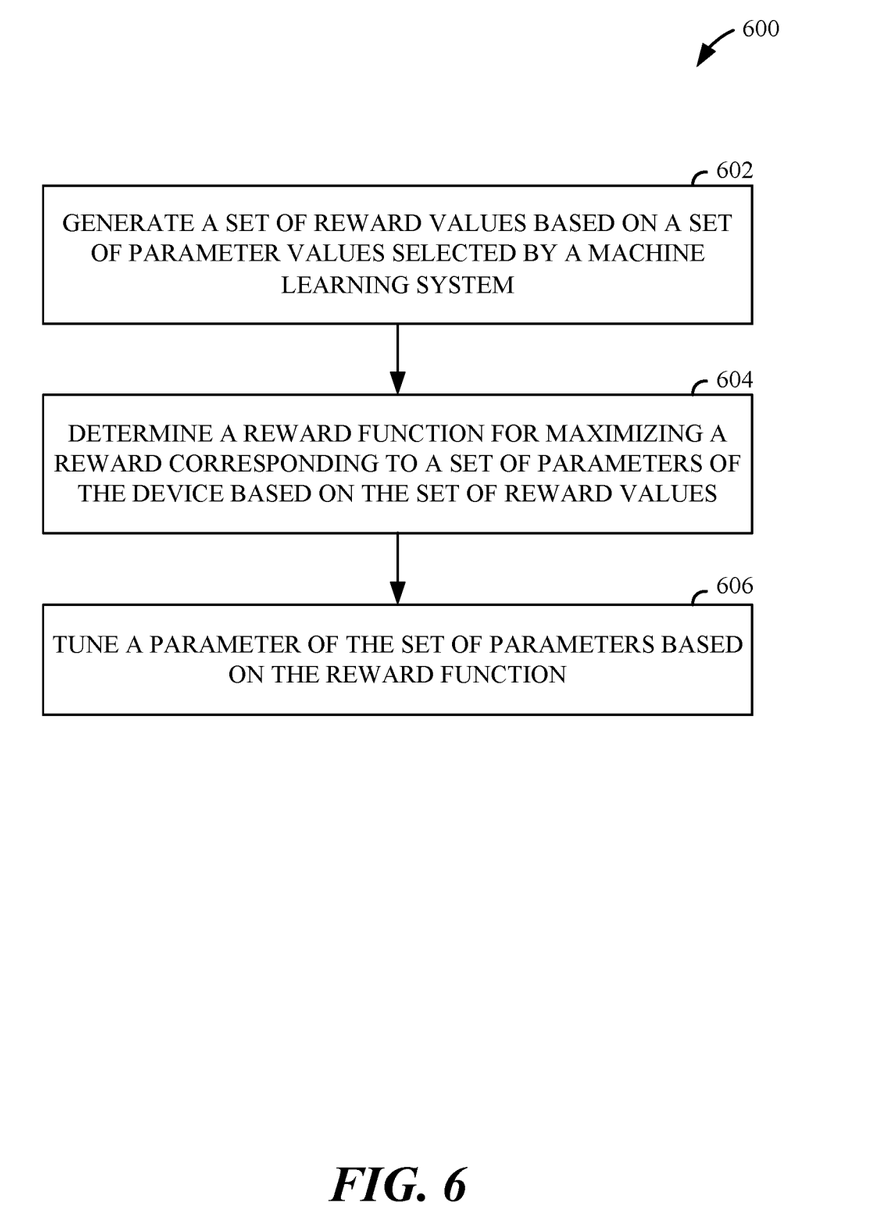
FIG. 6 is a flow diagram illustrating an example process performed, for example, by a parameter tuning device, in accordance with various aspects of the present disclosure.

FIG. 6 is a diagram illustrating an example process 600 performed, for example, by a parameter tuning device, in accordance with various aspects of the present disclosure. The process 600 may be performed by a machine learning system implementing a machine learning model, such as a reinforcement learning model.

As shown in FIG. 6, at block 602, the process 600 generates a set of reward values based on a set of parameter values selected by the machine learning system. Each reward value of the set of reward values may correspond to a parameter value of the set of parameter values programmed at a device. The device may be a dynamic random access memory (DRAM), a high-speed DRAM, or another type of device with programmable parameters.

At block 604, the process 600 determines a reward function for maximizing a reward corresponding to a set of parameters of the device based on the set of reward values. In one configuration, the process 600 may determine the reward function based on the process described with reference with FIG. 4. For example, the process 400 may randomly select a first parameter value of the set of parameter values, program the device with the first parameter value, sample a first data eye in response to programming the device with the first parameter value, generate a first reward value of the set of reward values based on the first data eye, and determine the reward function based on the first reward value. The first reward value may be generated by determining a reward criteria including stability of a data path and/or power consumption of the device based on the first data eye, and generating the first reward value based on the determined reward criteria.

In one configuration, for determining the reward function, the process 600 may determine an uncertainty of the reward function is greater than a threshold and selecting a second parameter value of the set of parameter values based on the uncertainty. In response to select the second parameter value, the process 600 may program the device with the second parameter value and sample a second data eye in response to programming the device with the second parameter value. Additionally, the process 600 may generate a second reward value of the set of reward values based on the second data eye and update the reward function based on the second reward value.

At block 606, the process 600 tunes a parameter of the set of parameters based on the reward function. In one configuration, the parameters may include a global parameter corresponding to all bits of an interface of the device, a channel parameter corresponding to bits of a channel of the device, or a per-bit parameter corresponding to a single data-line of the device. The tuning may include identifying a number of reward values from a number of values for the parameter based on the reward function. Each reward value of the number of reward values may correspond to one of the number of values. Additionally, the tuning may include selecting a value from the number of values corresponding to a maximum reward value of the number of reward values and applying the selected value to the parameter. In one configuration, the parameter may be tuned in response to a health-check of the device, failure of the device, or a data-eye analysis of the device.

The various operations of methods described above may be performed by any suitable means capable of performing the corresponding functions. The means may include various hardware and/or software component(s) and/or module(s), including, but not limited to, a circuit, an application specific integrated circuit (ASIC), or processor. Generally, where there are operations illustrated in the figures, those operations may have corresponding counterpart means-plus-function components with similar numbering.

As used, the term "determining" encompasses a wide variety of actions. For example, "determining" may include calculating, computing, processing, deriving, investigating, looking up (e.g., looking up in a table, a database or another data structure), ascertaining and the like. Additionally, "determining" may include receiving (e.g., receiving information), accessing (e.g., accessing data in a memory) and the like. Furthermore, "determining" may include resolving, selecting, choosing, establishing, and the like.

As used, a phrase referring to "at least one of" a list of items refers to any combination of those items, including single members. As an example, "at least one of: a, b, or c" is intended to cover: a, b, c, a-b, a-c, b-c, and a-b-c.

The various illustrative logical blocks, modules and circuits described in connection with the present disclosure may be implemented or performed with a general-purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, erasable programmable read-only memory (EPROM), electrically erasable programmable read-only memory (EEPROM), registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a device. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement signal processing functions. For certain aspects, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processor may be responsible for managing the bus and general processing, including the execution of software stored on the machine-readable media. The processor may be implemented with one or more general-purpose and/or special-purpose processors. Examples include microprocessors, microcontrollers, DSP processors, and other circuitry that can execute software. Software shall be construed broadly to mean instructions, data, or any combination thereof, whether referred to as software, firmware, middleware, microcode, hardware description language, or otherwise. Machine-readable media may include, by way of example, random access memory (RAM), flash memory, read only memory (ROM), programmable read-only memory (PROM), erasable programmable read-only memory (EPROM), electrically erasable programmable Read-only memory (EEPROM), registers, magnetic disks, optical disks, hard drives, or any other suitable storage medium, or any combination thereof. The machine-readable media may be embodied in a computer-program product. The computer-program product may comprise packaging materials.

In a hardware implementation, the machine-readable media may be part of the processing system separate from the processor. However, as those skilled in the art will readily appreciate, the machine-readable media, or any portion thereof, may be external to the processing system. By way of example, the machine-readable media may include a transmission line, a carrier wave modulated by data, and/or a computer product separate from the device, all which may be accessed by the processor through the bus interface. Alternatively, or in addition, the machine-readable media, or any portion thereof, may be integrated into the processor, such as the case may be with cache and/or general register files. Although the various components discussed may be described as having a specific location, such as a local component, they may also be configured in various ways, such as certain components being configured as part of a distributed computing system.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may comprise one or more neuromorphic processors for implementing the described models. As another alternative, the processing system may be implemented with an application specific integrated circuit (ASIC) with the processor, the bus interface, the user interface, supporting circuitry, and at least a portion of the machine-readable media integrated into a single chip, or with one or more field programmable gate arrays (FPGAs), programmable logic devices (PLDs), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

The machine-readable media may comprise a number of software modules. The software modules include instructions that, when executed by the processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module. Furthermore, it should be appreciated that aspects of the present disclosure result in improvements to the functioning of the processor, computer, machine, or other system implementing such aspects.

If implemented in software, the functions may be stored or transmitted over as one or more instructions or code on a computer-readable medium. Computer-readable media include both computer storage media and communication media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Additionally, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented. For example, such a computer program product may comprise a computer-readable medium having instructions stored (and/or encoded) thereon, the instructions being executable by one or more processors to perform the operations described. For certain aspects, the computer program product may include packaging material.

Further, it should be appreciated that modules and/or other appropriate means for performing the methods and techniques described can be downloaded and/or otherwise obtained by a user terminal and/or base station as applicable. For example, such a device can be coupled to a server to facilitate the transfer of means for performing the methods described. Alternatively, various methods described can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described to a device can be utilized.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A method performed by a machine learning system, comprising:
   measuring an electrical reference signal transmitted through an interface of a device memory programmed with a set of on-chip memory parameter values;
   generating a first data eye representing a voltage and time plot of the transmitted electrical reference signal in accordance with measuring the electrical reference signal;
   generating a set of reward values based on sequentially sampling a group of data eye points from the first data eye, each reward value of the set of reward values corresponding to a data eye point, of the group of data eye points, associated with a respective on-chip memory parameter value of the set of on-chip memory parameter values, each data eye point corresponding to one or more of stability of a data path associated with the device memory or power consumption of the device memory, each on-chip memory parameter value corresponding to an on-chip memory parameter of a set of on-chip memory parameters including one or more of a pull-up/pull-down parameter, an on-die-termination parameter, or a read/write turn-around time parameter, the device memory comprising random access memory;
   determining a reward function that models a relationship between the set of on-chip memory parameter values of the device memory and the set of reward values; and
   tuning, in response to a tuning triggering event, the device memory with one or more on-chip memory parameter values of the set of on-chip memory parameter values, the one or more on-chip memory parameter values having a highest reward from the reward function.

2. The method of claim 1, further comprising:
   randomly selecting a first on-chip memory parameter value of the set of on-chip memory parameter values;
   programming the device memory with the first on-chip memory parameter value;
   sampling a first data eye point of the group of data eye points in response to programming the device memory with the first on-chip memory parameter value;
   generating a first reward value of the set of reward values based on the first data eye point; and
   determining the reward function based on the first reward value.

3. The method of claim 2, further comprising:
   determining an uncertainty of the reward function is greater than a threshold;
   selecting a second on-chip memory parameter value of the set of on-chip memory parameter values based on the uncertainty;
   programming the device memory with the second on-chip memory parameter value;
   sampling a second data eye point from the group of data eye points in response to programming the device memory with the second on-chip memory parameter value;
   generating a second reward value of the set of reward values based on the second data eye point; and
   updating the reward function based on the second reward value.

4. The method of claim 2, in which the data path and the power consumption of the device memory are associated with the first data eye.

5. The method of claim 1, in which at least one of the one or more on-chip memory parameter values comprises a global parameter corresponding to all bits of the interface of the device memory, a channel parameter corresponding to bits of a channel of the device memory, or a per-bit parameter corresponding to a single data-line of the device memory.

6. The method of claim 1, in which the device memory comprises a dynamic random access memory (DRAM).

7. The method of claim 1, further comprising tuning the device memory in response to a health-check of the device memory, failure of the device memory, or a data-eye analysis of the device memory.

8. The method of claim 1, in which the tuning triggering event includes one or more of a health-check, failure detection, or a data-eye analysis.

9. An apparatus for a machine learning system, comprising:
   at least one processor;
   device memory coupled with the at least one processor; and
   instructions stored in the device memory and operable, when executed by the at least one processor, to cause the apparatus:
      to measure an electrical reference signal transmitted through an interface of the device memory programmed with a set of on-chip memory parameter values;
      to generate a first data eye representing a voltage and time plot of the transmitted electrical reference signal in accordance with measuring the electrical reference signal;
      to generate a set of reward values based on sequentially sampling a group of data eye points from the first data eye, each reward value of the set of reward values corresponding to a data eye point, of the group of data eye points, associated with a respective on-chip memory parameter value of the set of on-chip memory parameter values, each data eye point corresponding to one or more of stability of a data path associated with the device memory or power consumption of the device memory, each on-chip memory parameter value corresponding to an on-chip memory parameter of a set of on-chip memory parameters including one or more of a pull-up/pull-down parameter, an on-die-termination parameter, or a read/write turn-around time parameter, the device memory comprising random access memory;

to determine a reward function that models a relationship between the set of on-chip memory parameter values of the device memory and the set of reward values; and to tune, in response to a tuning triggering event, the device memory with one or more on-chip memory parameter values of the set of on-chip memory parameter values, the one or more on-chip memory parameter values having a highest reward from the reward function.

10. The apparatus of claim 9, in which the instructions further cause the apparatus:
to randomly select a first on-chip memory parameter value of the set of on-chip memory parameter values;
to program the device memory with the first on-chip memory parameter value;
to sample a first data eye point of the group of data eye points in response to programming the device memory with the first on-chip memory parameter value;
to generate a first reward value of the set of reward values based on the first data eye point; and
to determine the reward function based on the first reward value.

11. The apparatus of claim 10, in which the instructions further cause the apparatus:
to determine an uncertainty of the reward function is greater than a threshold;
to select a second on-chip memory parameter value of the set of on-chip memory parameter values based on the uncertainty;
to program the device memory with the second on-chip memory parameter value;
to sample a second data eye point from the group of data eye points in response to programming the device memory with the second on-chip memory parameter value;
to generate a second reward value of the set of reward values based on the second data eye point; and
to update the reward function based on the second reward value.

12. The apparatus of claim 10, in which the data path and the power consumption of the device memory are associated with the first data eye.

13. The apparatus of claim 9, in which at least one of the one or more on-chip memory parameter values comprises a global parameter corresponding to all bits of the interface of the device memory, a channel parameter corresponding to bits of a channel of the device memory, or a per-bit parameter corresponding to a single data-line of the device memory.

14. The apparatus of claim 9, in which the device memory comprises a dynamic random access memory (DRAM).

15. The apparatus of claim 9, in which the instructions further cause the apparatus to tune the device memory in response to a health-check of the device memory, failure of the device memory, or a data-eye analysis of the device memory.

16. The apparatus of claim 9, in which the tuning triggering event includes one or more of a health-check, failure detection, or a data-eye analysis.

17. A non-transitory computer-readable medium having program code recorded thereon, the program code executed by at least one processor and comprising:
program code to measure an electrical reference signal transmitted through an interface of a device memory programmed with a set of on-chip memory parameter values;
program code to generate a first data eye representing a voltage and time plot of the transmitted electrical reference signal in accordance with measuring the electrical reference signal;
program code to generate a set of reward values based on sequentially sampling a group of data eye points from the first data eye, each reward value of the set of reward values corresponding to a data eye point, of the group of data eye points, associated with a respective on-chip memory parameter value of the set of on-chip memory parameter values, each data eye point corresponding to one or more of stability of a data path associated with the device memory or power consumption of the device memory, each on-chip memory parameter value corresponding to an on-chip memory parameter of a set of on-chip memory parameters including one or more of a pull-up/pull-down parameter, an on-die-termination parameter, or a read/write turn-around time parameter, the device memory comprising random access memory;
program code to determine a reward function that models a relationship between the set of on-chip memory parameter values of the device memory and the set of reward values; and
program code to tune in response to a tuning triggering event, the device memory with one or more on-chip memory parameter values of the set of on-chip memory parameter values, the one or more on-chip memory parameter values having a highest reward from the reward function.

18. The non-transitory computer-readable medium of claim 17, in which the program code further comprises:
program code to randomly select a first on-chip memory parameter value of the set of on-chip memory parameter values;
program code to program the device memory with the first on-chip memory parameter value;
program code to sample a first data eye point of the group of data eye points in response to programming the device memory with the first on-chip memory parameter value;
program code to generate a first reward value of the set of reward values based on the first data eye point; and
program code to determine the reward function based on the first reward value.

19. The non-transitory computer-readable medium of claim 18, in which the program code further comprises:
program code to determine an uncertainty of the reward function is greater than a threshold;
program code to select a second on-chip memory parameter value of the set of on-chip memory parameter values based on the uncertainty;
program code to program the device memory with the second on-chip memory parameter value;

program code to sample a second data eye point from the group of data eye points in response to programming the device memory with the second on-chip memory parameter value;
program code to generate a second reward value of the set of reward values based on the second data eye point; and
program code to update the reward function based on the second reward value.

20. The non-transitory computer-readable medium of claim 18, in which the data path and the power consumption of the device memory are associated with the first data eye.

21. The non-transitory computer-readable medium of claim 17, in which at least one of the one or more on-chip memory parameter values comprises a global parameter corresponding to all bits of the interface of the device memory, a channel parameter corresponding to bits of a channel of the device memory, or a per-bit parameter corresponding to a single data-line of the device memory.

22. The non-transitory computer-readable medium of claim 17, in which the device memory comprises a dynamic random access memory (DRAM).

23. The non-transitory computer-readable medium of claim 17, in which the program code further comprises program code to tune the device memory in response to a health-check of the device memory, failure of the device memory, or a data-eye analysis of the device memory.

24. The non-transitory medium of claim 17, in which the tuning triggering event includes one or more of a health-check, failure detection, or a data-eye analysis.

25. An apparatus for implementing a machine learning system, comprising:
means for measuring an electrical reference signal transmitted through an interface of a device memory programmed with a set of on-chip memory parameter values;
means for generating a first data eye representing a voltage and time plot of the transmitted electrical reference signal in accordance with measuring the electrical reference signal;
means for generating a set of reward values based on sequentially sampling a group of data eye points from the first data eye, each reward value of the set of reward values corresponding to a data eye point, of the group of data eye points, associated with a respective on-chip memory parameter value of the set of on-chip memory parameter values, each data eye point corresponding to one or more of stability of a data path associated with the device memory or power consumption of the device memory, each on-chip memory parameter value corresponding to an on-chip memory parameter of a set of on-chip memory parameters including one or more of a pull-up/pull-down parameter, an on-die-termination parameter, or a read/write turn-around time parameter, the device memory comprising random access memory;
means for determining a reward function that models a relationship between the set of on-chip memory parameter values of the device memory and the set of reward values; and
means for tuning, in response to a tuning triggering event, the device memory with one or more on-chip memory parameter values of the set of on-chip memory parameter values, the one or more on-chip memory parameter values having a highest reward from the reward function.

26. The apparatus of claim 25, further comprising:
means for randomly selecting a first on-chip memory parameter value of the set of on-chip memory parameter values;
means for programming the device memory with the first on-chip memory parameter value;
means for sampling a first data eye point of the group of data eye points in response to programming the device memory with the first on-chip memory parameter value;
means for generating a first reward value of the set of reward values based on the first data eye point; and
means for determining the reward function based on the first reward value.

27. The apparatus of claim 26, further comprising:
means for determining an uncertainty of the reward function is greater than a threshold;
means for selecting a second on-chip memory parameter value of the set of on-chip memory parameter values based on the uncertainty;
means for programming the device memory with the second on-chip memory parameter value;
means for sampling a second data eye point from the group of data eye points in response to programming the device memory with the second on-chip memory parameter value;
means for generating a second reward value of the set of reward values based on the second data eye point; and
means for updating the reward function based on the second reward value.

28. The apparatus of claim 26, in which the data path and the power consumption of the device memory are associated with the first data eye.

29. The apparatus of claim 25, in which at least one of the one or more on-chip memory parameter values comprises a global parameter corresponding to all bits of the interface of the device memory, a channel parameter corresponding to bits of a channel of the device memory, or a per-bit parameter corresponding to a single data-line of the device memory.

30. The apparatus of claim 25, in which the tuning triggering event includes one or more of a health-check, failure detection, or a data-eye analysis.

* * * * *